(12) United States Patent
Allah et al.

(10) Patent No.: US 7,977,850 B2
(45) Date of Patent: Jul. 12, 2011

(54) BULK ACOUSTIC WAVE DEVICE WITH A SEMICONDUCTOR LAYER

(75) Inventors: Mohamed Abd Allah, Munich (DE); Werner Weber, Munich (DE); Robert Thalhammer, Munich (DE); Jyrki Kaitila, Riemerling (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 475 days.

(21) Appl. No.: 12/040,088

(22) Filed: Feb. 29, 2008

(65) Prior Publication Data

US 2009/0218912 A1 Sep. 3, 2009

(51) Int. Cl.
*H01L 41/08* (2006.01)

(52) U.S. Cl. .......................................... 310/320

(58) Field of Classification Search ............ 310/320, 310/334, 363, 365, 364, 321, 324, 366; 333/191, 333/192–193, 187, 189, 190; *H01L 41/08; H03H 9/17*
See application file for complete search history.

(56) References Cited

U.S. PATENT DOCUMENTS

| | | | |
|---|---|---|---|
| 7,098,573 B2 * | 8/2006 | Stommer ..................... | 310/320 |
| 7,362,035 B2 * | 4/2008 | Jang et al. ................... | 310/320 |
| 2009/0295506 A1 * | 12/2009 | Handtmann et al. ......... | 333/192 |

* cited by examiner

*Primary Examiner* — Thomas M Dougherty
*Assistant Examiner* — Karen Addison

(57) ABSTRACT

A bulk acoustic wave device includes a first electrode, a second electrode, a piezoelectric layer arranged between the first and second electrodes and a semiconductor layer arranged between the first and second electrodes. The semiconductor layer is electrically isolated from the first electrode.

15 Claims, 10 Drawing Sheets

BULK ACOUSTIC WAVE DEVICE WITH A SEMICONDUCTOR LAYER

BACKGROUND

Embodiments of the present invention relate to the field of bulk acoustic wave devices and especially to devices comprising a semiconductor layer and a method of frequency tuning of a BAW device (BAW=Bulk Acoustic Wave).

SUMMARY OF THE INVENTION

Embodiments of the present invention relate to a bulk acoustic wave device. The BAW device comprises a first electrode, a second electrode, a piezoelectric layer arranged between the first and second electrodes and a semiconductor layer arranged between the first and second electrodes. The semiconductor layer is electrically isolated from the first electrode.

BRIEF DESCRIPTION OF THE DRAWINGS

Features of embodiments of the invention will be more readily appreciated and better understood by reference to the following detailed description, which should be considered with reference to the accompanying drawings, in which.

Figure 1:
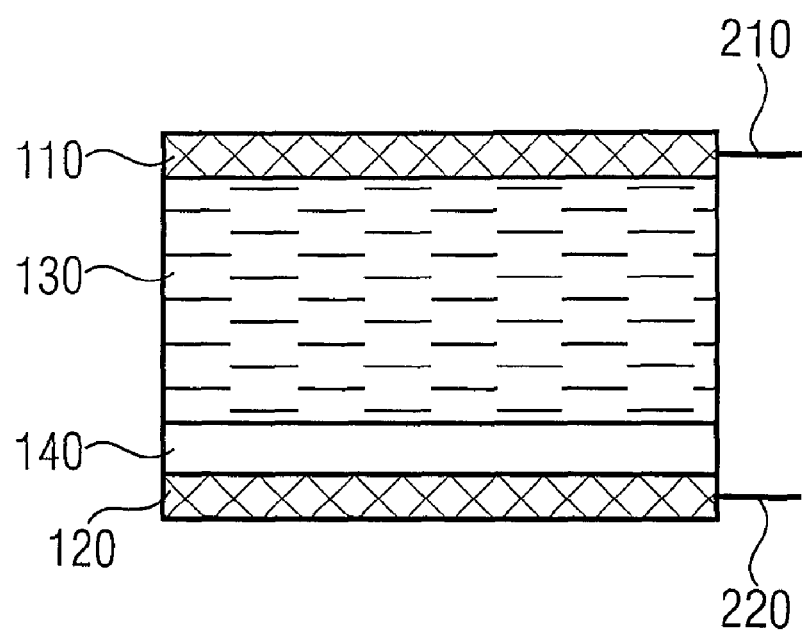
FIG. 1 shows a cross sectional view of a BAW resonator according to an embodiment of the present invention.

Before embodiments of the present invention will be explained in more detail below with reference to the drawings, it is to be noted that equal elements, or those operating in an equal way, are provided with the same or similar reference numerals in the Figures, and that a repeated description of these elements is omitted.

DETAILED DESCRIPTION OF ILLUSTRATIVE EMBODIMENTS

Presently, BAW devices are primarily used as filters and there is a need to apply BAW devices as high frequency resonators, of which no products are available yet. The frequency response of a BAW resonator is mainly characterized by two resonance frequencies, namely the series resonance frequency and the parallel resonance frequency. The frequencies of the resonance (series or parallel) are, for example, determined by properties of the materials inside the resonator structure and the (resonator) device geometry. Once the device is manufactured, changing one of its frequencies can be realized by adding extra tuning elements (comprising, for example, a capacitor or an inductor) to the resonator either in series or in parallel configuration.

In the series resonance, the trimming of the frequency (adjusting the frequency to a desired value) is performed through a capacitor in series with the BAW device. The trimming leads to a slight change in the series resonance, wherein the change can be tuned by a tunable capacitance of the capacitor. An increased capacitance of the capacitor leads to a shift of the series resistance resonance to a higher value in frequency, whereas the parallel resonance is unchanged.

It is also possible to use a trimming capacitance to change the parallel resonance frequency. This can be achieved by using the trimming capacitor in parallel with the bulk capacitance of the resonator. In analogy to the case above, the trimming leads to a slight change in the parallel resonance, wherein the change can be tuned by a tunable capacitance of the capacitor. An increased capacitance of the capacitor leads to a shift of the parallel resistance resonance to a lower value in frequency, whereas the serial resonance is unchanged.

Conventional solutions for trimming the resonance frequencies of a BAW device use additional capacitors. The BAW device has two independent devices, or as two devices formed on the same wafer, and then connected electrically through metallization layers. The disadvantages of this setup concern, for example, costs (in terms of chip size and yield) and losses due to the resistance path between the resonator and the trimming capacitance. Therefore, there is a need for integrating a capacitor with tunable capacitance into a bulk acoustic wave resonator for frequency tuning.

A conventional device stack of a solidly-mounted BAW device comprises, for example, top and bottom metal electrodes (or a first and second electrode) enclosing a piezoelectric layer, which is formed on an acoustic mirror, which, in turn, is formed on (or in) a substrate. As an example, on top of a semiconductor substrate, layers of high and low acoustic impedance material interchange to form an acoustical mirror to prevent the acoustic wave from penetrating through the substrate.

According to embodiments of the present invention, for example, a moderately-doped crystalline semiconductor layer is added. By applying a negative (positive for n-type semiconductor) voltage between the top and bottom electrodes, a depletion zone is formed whose thickness depends on the value of the voltage applied. The resulting configuration is similar in some ways to a MOS capacitor structure (MOS=Metal on Semiconductor) using, for example, the piezoelectric material of the BAW device as the dielectric between the metal and the semiconductor in the MOS structure. In further embodiments, an optional oxide layer can be added between the piezoelectric layer and the crystalline semiconductor layer without a loss of generality.

By applying a DC voltage (DC=Directed Current) between the top and bottom electrodes of the MOS capacitor, the majority carriers are depleting from the interface between the dielectric and the semiconductor. A further increase in voltage leads to further increase in the depletion region. The increase in voltage can be performed up to a certain value before inversion where the minority carrier density comes larger than the majority carrier density, whereas the certain value also depends on the capacitance behavior of the MOS structure with the frequency range of the resonator.

Hence, embodiments of the present invention include a BAW device with a first electrode, a second electrode, a piezoelectric layer arranged between the first and second electrodes and further including a semiconductor layer arranged between the first and second electrodes, preferably wherein the semiconductor layer is electrically isolated from the first electrode. The first and second electrodes and the piezoelectric layer build a BAW resonator and the semiconductor layer forms a means for tuning the resonance frequency, which is integral with the BAW resonator.

The thickness of the depletion layer defines the capacitance. Different voltages lead to different depletion layer thicknesses and different doping levels lead to different depletion thickness ranges as well as to different sensitivities of the depletion layer thickness on voltage changes. For example, low doping leads to higher sensitivity of the depletion layer thickness on voltage changes, so that a slight voltage change yields a high capacitance change. For this reason, the doping of the semiconductor layer should be adjusted to allow for a comfortable (easy-to-handle) voltage range during trimming. The available voltage range depends on the concrete device structure, in which the BAW device is integrated. The preferred doping level depends also on variations of the frequency range over which a frequency tuning should be possible. If the process variations are severe also the trimming capacity should be tunable over a wide range.

The semiconductor layer can, for example, be arranged between the piezoelectric layer and one of the electrodes, so that the capacitance of the depletion layer acts as a serial capacitor. Another possibility is that the capacitance of the depletion layer acts as a parallel capacitor, which can be achieved by forming the semiconductor layer besides the piezoelectric layer, so that it is connected in parallel for the alternating current path. This can, for example, be achieved by forming an isolating layer on the bottom electrode and by forming the semiconductor layer next to the piezoelectric layer on the isolating layer and finally by forming the top electrode on both the semiconductor layer and the piezoelectric layer. In this way, the piezoelectric layer and the semiconductor layer are (with respect to electrode layers) laterally next to each other.

Hence, embodiments rely on the implementation of a crystalline semiconductor layer, which acts as a depletion capacitance (MOS capacitor structure) inside the resonator for easy voltage-controlled trimming of series or parallel resonance frequency of a BAW-based resonator by applying a DC voltage. The DC voltage may change during operation, for example, in order to compensate for a drift of the frequency while operation. The crystalline semiconductor layer used for the MOS capacitor structure can, for example, comprise silicon and can be added between an oxide and any of the two electrodes of the resonator, which comprise, for example, metal. However, there is no need for the semiconductor layer of being in direct contact with the electrodes. The semiconductor layer can also be arranged between the piezoelectric layer itself if it shows a dielectric behavior and any of the two electrodes of the resonator.

Embodiments of the present invention also comprise a method for manufacturing a BAW device, comprising forming a first electrode and a second electrode, arranging a piezoelectric layer and a semiconductor layer between the first and second electrodes, so that the semiconductor layer is electrically isolated from the first electrode.

Moreover, embodiments comprise a method for tuning a frequency of a BAW resonator, comprising adjusting a DC voltage between the first and second electrodes, so that a depletion layer forms in a semiconductor layer. The DC voltage is adjusted until the BAW resonator comprises a desired value for the serial resonance frequency and/or the parallel resonance frequency.

Embodiments comprise various advantages. First of all, there is a cost advantage, because one device can usually be manufactured more cheaply than two with the same performance. In addition, there is less board space needed, since the capacitor for tuning is integrated in the BAW resonator. Moreover, the tuning range of the frequency (by tuning the DC-voltage, for example) can be used to overcome and correct deviations in frequency due to process deviations, for example, layer thickness variations of the electrode layers and/or piezoelectric layer. In addition, this tuning capability can be used to compensate for frequency deviations due to temperature changes while operation. Finally, this BAW device can also be used as the frequency-changing element in a voltage control oscillator (VCO).

FIG. 1 shows a BAW device according to an embodiment of the present invention. The BAW device comprises a first electrode 110 (or first electrode layer), a second electrode 120 (or second electrode layer), a piezoelectric layer 130 arranged between the first and second electrodes 110, 120 and a semiconductor layer 140 arranged between the second electrode 120 and the piezoelectric layer 130. The piezoelectric layer 130 electrically isolates the semiconductor layer 140 from the first electrode 110. A first terminal 210 furthermore contacts the first electrode 110 and a second terminal 220 contacts the second electrode 120.

Figure 2:
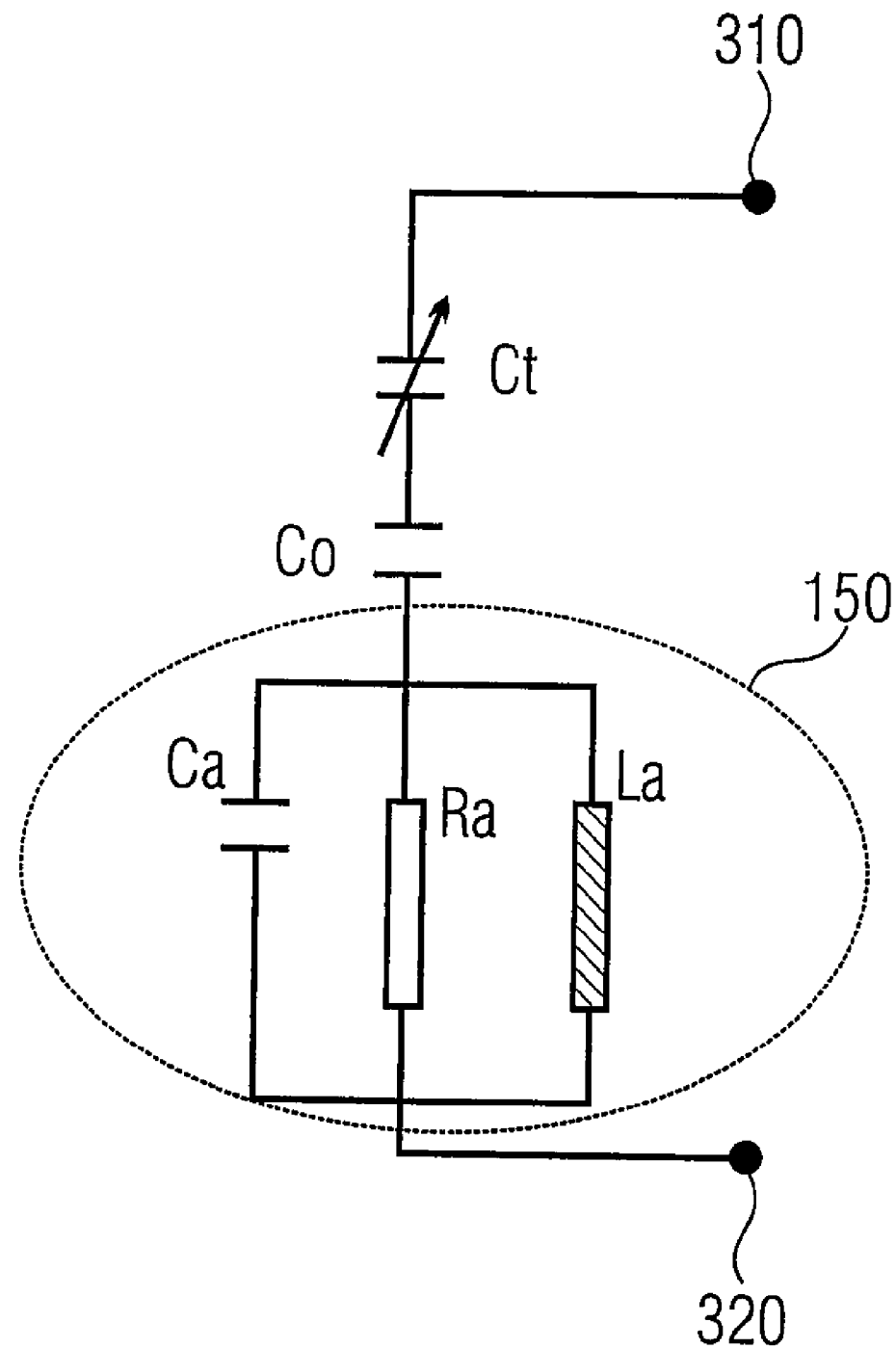
FIG. 2 shows an equivalent circuit of a BAW device.

FIG. 2 shows an equivalent circuit of a BAW device with equivalent elements, which comprise a capacitor Ca, an inductor La, a resistor Ra representing acoustic contributions and an electric capacitor C0 in a resonance circuit. The acoustic contributions 150 to the impedance for this series resonance are within the dashed line. In addition, a trimming capacitance Ct is included in series and the equivalent elements connect a first terminal 310 and a second terminal 320.

The trimming of the corresponding serial resonance frequency can be achieved by tuning the capacitance Ct. The trimming capacitance Ct can be continuously tunable, so that the series resonance frequency can be changed (within a certain range) by changing the trimming capacitance Ct.

Thus, an equivalent circuit for a BAW device comprises, as equivalent elements, a capacitance, an inductance and a resistance, which model the acoustic properties of the BAW device. In addition, the equivalent circuit for a BAW device comprises an electric capacitance. The equivalent elements are, for example, related to the geometry of the BAW device as well as dielectric properties of the piezoelectric layer (e.g., layer thicknesses and/or specific dielectric constants for the piezoelectric layer).

Figure 3A:
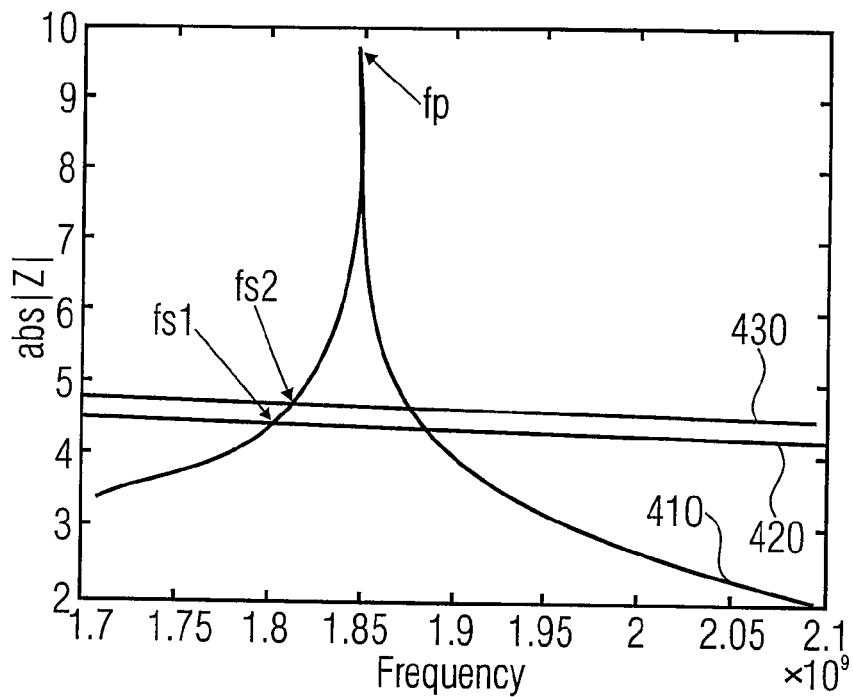
FIG. 3A shows characteristics of the BAW resonator and series resistances.

FIG. 3A shows the characteristics of a BAW resonator and the original and the increased series resistance. In detail, FIG. 3A shows the absolute value of the impedance as a function of the frequency (measured, for example, in GHz). A first graph 410 shows the frequency dependence of the absolute value of the impedance (abs|Z|) for the BAW resonator related to the equivalent circuit within the dashed line 150 of FIG. 2. The first graph 410 shows a sharp maximum at around 1.85 GHz related to the resonance frequency of the equivalent circuit in FIG. 2. A second graph 420 shows the frequency dependence of the impedance of the electric capacitor C0 and a third graph 430 shows the increased resistance (abs|Z|) of the capacitors Ct and C0 as a function of the frequency.

Figure 3B:
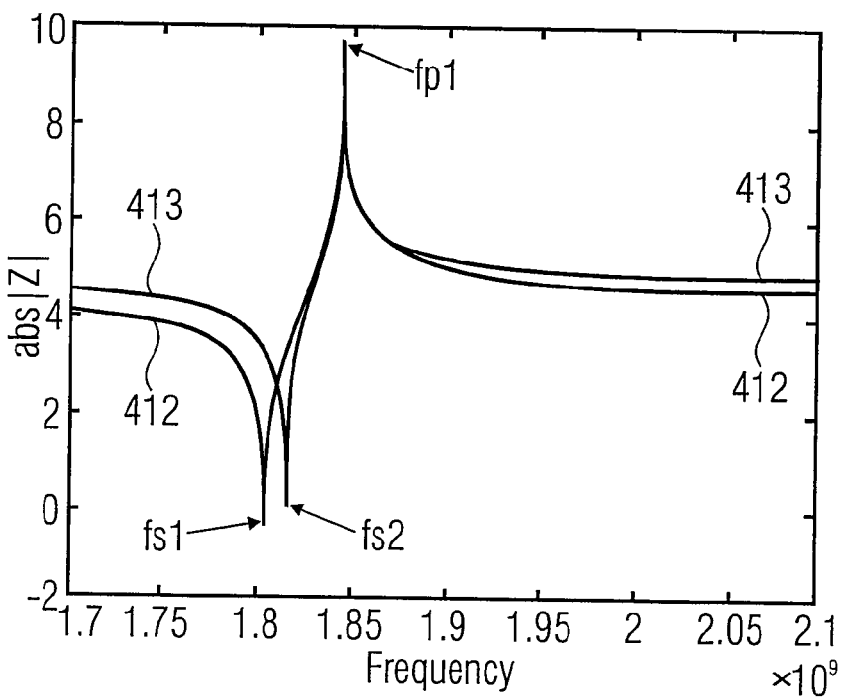
FIG. 3B shows combination characteristics of the BAW resonator and the series resistances.

FIG. 3B shows combination characteristics of the equivalent circuit of FIG. 2, that means combining the acoustic contributions 150 as well as the electric contributions. The impedance is, again, shown as function of the frequency as, for example, measured in GHz. A first graph 412 shows a combination of the acoustic contribution with the original capacitance (the electric capacitor C0). A second graph 413, which is above the first graph 412 shows a combination of the acoustic contributions with the decreased capacitance related to the (additional) trimming capacitance Ct. Therefore, the first graph 412 shows a combination of the acoustic contributions 150 with the electric capacitance C0 and the second graph 413 shows a combined impedance of all elements (in FIG. 2)—the acoustic contributions 150, the electric capacitance C0 and the trimming capacitance Ct.

Both graphs show a parallel resonance peak fp1 at around 1.85 GHz and, in addition, related to the serial resonances, a first serial resonance frequency fs1 in the first graph 412 and a second serial resonance frequency fs2 in the second graph 413, wherein the second resonance frequency fs2 is above the first serial resonance frequency fs1. Therefore, the additional serial capacitance leads to a shift of the series resonance fs to a higher value in frequency, whereas the parallel resonance fp is unchanged.

At the serial resonance frequencies, fs1 and fs2, the impedance is at its minimum, whereas at the parallel resonance frequencies fp1, the absolute value of the impedance attains its maximum. The shift in the resonance frequency from fs1 to fs2 is caused by the additional trimming capacitance Ct, because the second graph 413 comprise both the original electric capacitance C0 and the trimming capacitance Ct.

Figure 4A:
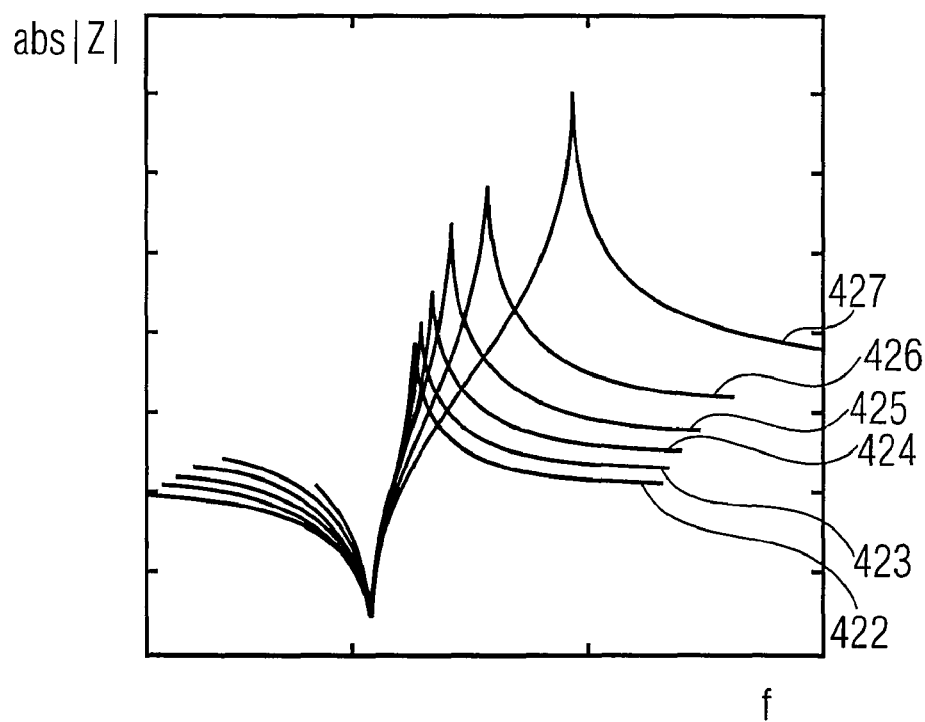
FIG. 4A shows different frequency responses for different values of shunted variable capacitors.
Figure 4B:
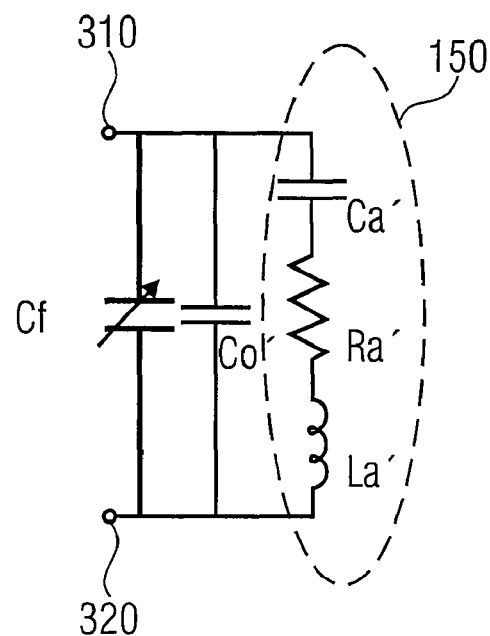
FIG. 4B shows an equivalent circuit of a BAW resonator with a tunable parallel capacitor.

FIGS. 4A and 4B show a trimming related to a change of the parallel resonance frequency, appearing as poles in the absolute value for the impedance. This can be achieved by using a trimming capacitor in parallel to the bulk capacitance of the resonator C0.

For the parallel resonance, a further equivalent circuit is shown in FIG. 4B, again comprising acoustic contributions 150 to the impedance, which comprise a capacitance Ca', a resistance Ra' and an inductance La', which are connected in serial. For the parallel resonance, the further equivalent circuit of FIG. 4B comprises a parallel electric capacitor C0' and a parallel trimming capacitor Ct, which are both connected in parallel to the acoustic elements 150 and connecting the first terminal 310 and the second terminal 320. The circuits in FIGS. 2 and 4B can be transformed to each other and, therefore, different symbols (Ca', Ra', La' and C0') are used in the further circuit of FIG. 4B.

FIG. 4A shows the characteristics (the dependence of the absolute value of the impedance from the frequency) for different values of the tunable parallel capacitor Ct. In this case, the serial resonance (minimum in the characteristics) is unchanged, whereas the parallel resonances (poles in the characteristics) are shifted related to different values of the tunable parallel capacitance Ct. In detail, a first graph 422, a second graph 423, a third graph 424, a fourth graph 425, a fifth graph 426 and a sixth graph 427 are shown. In comparison to FIGS. 3A and 3B, the parallel resonance of FIGS. 4A and 4B show a mirrored situation in the sense the higher the tunable resonance Ct, the lower the impedance values (the first graph 422 corresponds to a higher value for the trimming capacitance Ct than the sixth graph 427).

Figure 5:
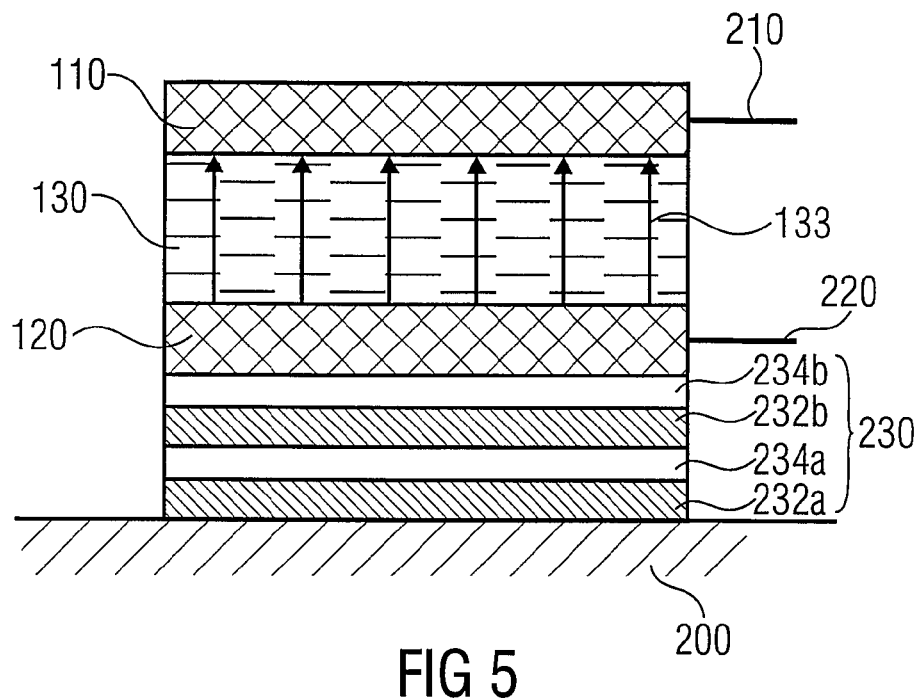
FIG. 5 shows a typical stack of a BAW device.

FIG. 5 shows a typical stack of a conventional BAW device, comprising a first electrode 110 (top electrode), a second electrode 120 (bottom electrode), and a piezoelectric layer 130 arranged between the first electrode 110 and the second electrode 120. The first electrode is connected to a first terminal 210 and the second electrode 120 is connected to a second terminal 220. The piezoelectric layer 130 comprises an average orientation (the orientation of the individual grains may be different), which is indicated by arrows 133 and is, for example, perpendicular to the first and second electrodes 110 and 120. In further embodiments, the orientation can be different.

The second electrode 120 is arranged on an acoustic mirror 230, the acoustic mirror 230 comprising a layer stack of alternating high and low acoustic impedance materials. For example, a first layer of high acoustic impedance 232a is arranged on a substrate 200, a first layer of low acoustic impedance 234a is arranged on the first layer of high acoustic impedance 232a, a second layer of high acoustic impedance 232b is arranged on the first layer of low acoustic impedance 234a and, finally, a second layer of low acoustic impedance 234b is arranged on the second layer of high acoustic impedance 232b.

Figure 6:
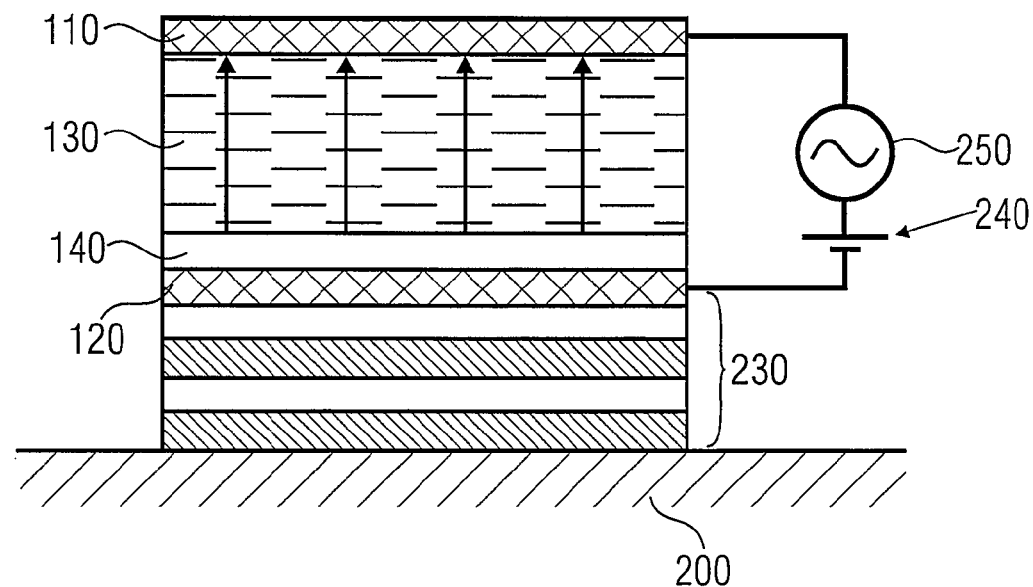
FIG. 6 shows a BAW device comprising an additional semiconductor layer.

FIG. 6 shows an embodiment of the present invention in which an additional semiconductor layer 140 is arranged between the second electrode 120 and the piezoelectric layer 130. The remaining layers are the same as shown in FIG. 5 and, therefore, a repeated description is omitted here. The semiconductor layer 140 can, for example, comprise silicon and can, for example, be moderately positively doped (p-type semiconductor) and, hence, leads to a trimmable capacitor, wherein the trimming can be done by a DC voltage 240, which is supplied to the first and second electrodes 110 and 120.

By changing the DC voltage 240, the capacitance of the MOS structure which, in the embodiment of FIG. 6, is given by the layer stack of the first electrode 110, the piezoelectric layer 130 and the semiconductor layer 140. After applying the DC voltage, a depletion region will be formed in the semiconductor layer 140, yielding an MOS capacitor. The DC voltage 240 is applied on top of the high frequency signal 250.

Figure 7A:
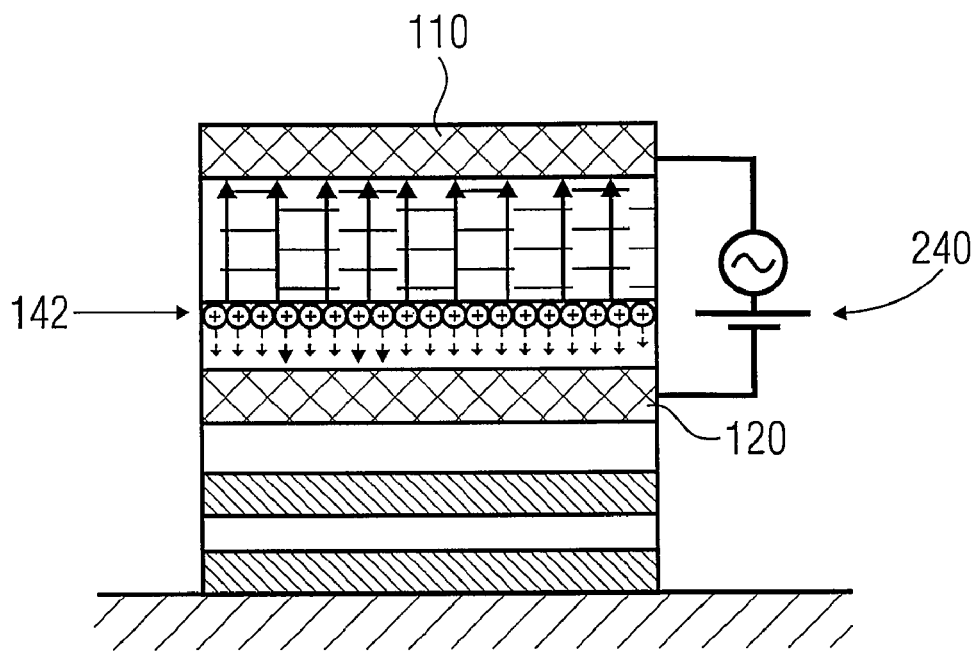
FIGS. 7A and 7B show a formation of a depletion zone by application of a voltage to the bottom and top electrode of the BAW device.

FIG. 7A shows a formation of the depletion zone 142 by applying a DC voltage 240 to the first and second electrodes 110 and 120. The applied DC-voltage depends on the doping level. The depletion zone 142 emerges due to the DC voltage 240, which carries away majority (charge) carriers (depending on the doping type holes or electrons) from the semiconductor layer 140 through the second electrode 120.

The semiconductor layer 140 can, for example, be p-doped silicon, so that the majority carriers are holes, which are carried away by a negative voltage applied to the second electrode 120 (that means the holes are "filled" by electrons). In another embodiment, the semiconductor layer 140 comprises an n-doped silicon, so that the majority carriers are electrons, which are carried away by applying a positive voltage to the second electrode 120.

Figure 7B:
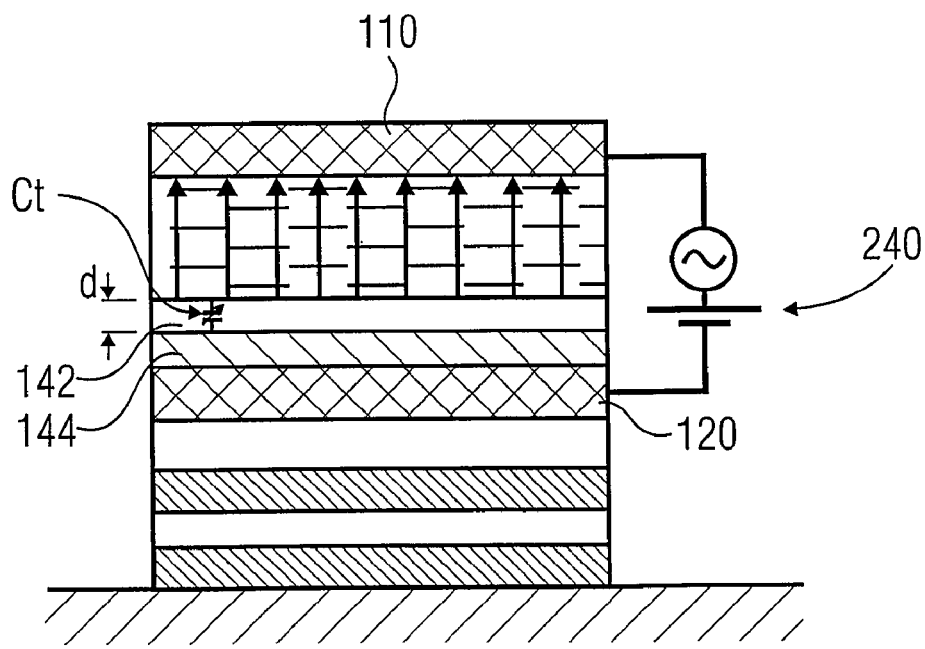

FIG. 7B is equivalent to FIG. 7A, wherein the depletion zone 142 is shown as a depletion layer with a depletion thickness d. Therefore, as a result of the depletion, the semiconductor layer 140 comprises a depletion layer (depletion zone) 142 and a remaining semiconductor layer 144, which remains p- or n-typed doped silicon, for example, with most of the majority carries still available (but physically it still remains one layer).

The depletion thickness d depends on the amount of DC voltage 240 applied to the first electrode 110 and the second electrode 120. In addition, the sensitivity in which the depletion layer 142 emerges by applying a DC voltage depends on the doping level, so that a lower doping level results in a higher sensitivity and vice versa. The equivalent circuit to the embodiment as shown in FIG. 7B was given in FIG. 2, wherein the trimming capacitance Ct is given by to the depletion layer 142 (MOS capacitance) and the value of the capacitance Ct is given by the depletion thickness d of the depletion layer 142.

By changing the DC voltage 240, it is possible to continuously change the serial resonance frequency, which results in a characteristic, as shown in FIG. 3B. By increasing the DC voltage, the trimming capacitance Ct increases and, hence, also the serial resonance frequency fs increases. By employing this mechanism it is possible to adjust the resonance frequency to a target value.

FIGS. 8A to 8E show a possible process flow for a manufacturing of the BAW device with a tunable resonance frequency.

Figure 8A:
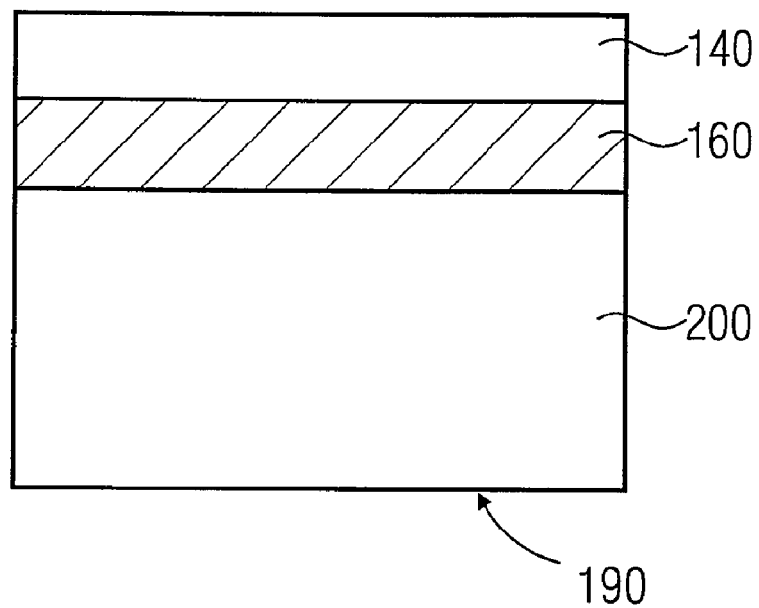
FIGS. 8A to 8E show a processing of a BAW device according to an embodiment.

FIG. 8A shows an isolating layer 160 arranged between the substrate 200 and the semiconductor layer 140, wherein the substrate 200 comprises a backside 190 opposite to the isolating layer 160. This layer arrangement can be formed by the SOI technique (SOI=silicon on insulator) resulting in an SOI wafer.

Figure 8B:
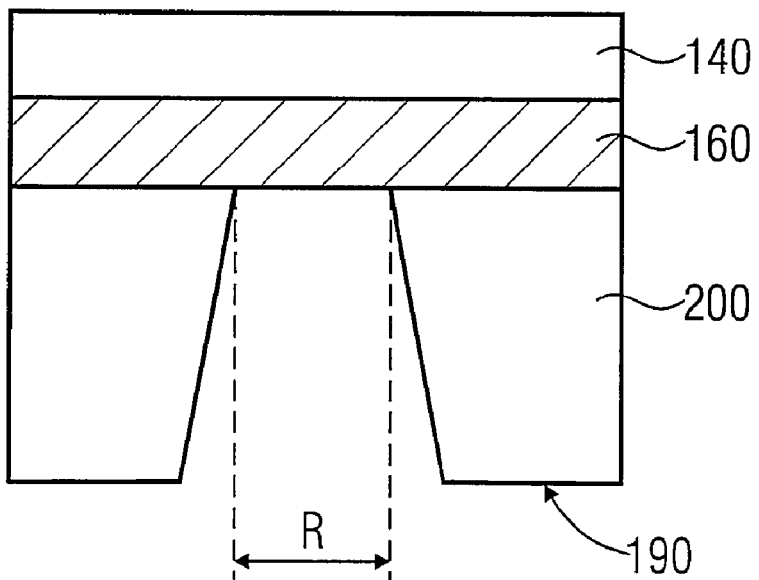

In FIG. 8B a next step is shown, wherein the isolating layer 160 is opened from the backside 190 of the substrate 200. For this, for example, a wet etching process can be performed from the backside 190 so that the wet etching stops on the isolating layer 160. The isolating layer 160 can, for example, comprise silicon oxide and the substrate 200 silicon for which wet etching processes are available. The isolating layer 160 can be opened over a region R, which will later define the region on which the bulk acoustic wave device is formed.

Figure 8C:
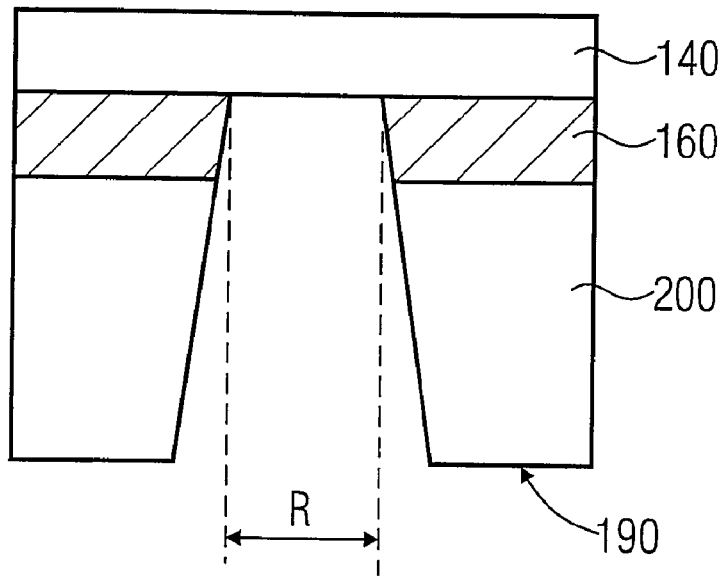

FIG. 8C shows a further step in which the isolating layer 160 is removed within the region R, so that the semiconductor layer 140 is open from the backside 190 of the substrate 200. This step of removing the isolating layer 160 can, for example, comprise a further wet etching step, which stops on the semiconductor layer 140. The removal of the isolating layer 140 can, again, comprise an etch step, which stops on the semiconductor layer 140, which comprises, for example, silicon.

Figure 8D:
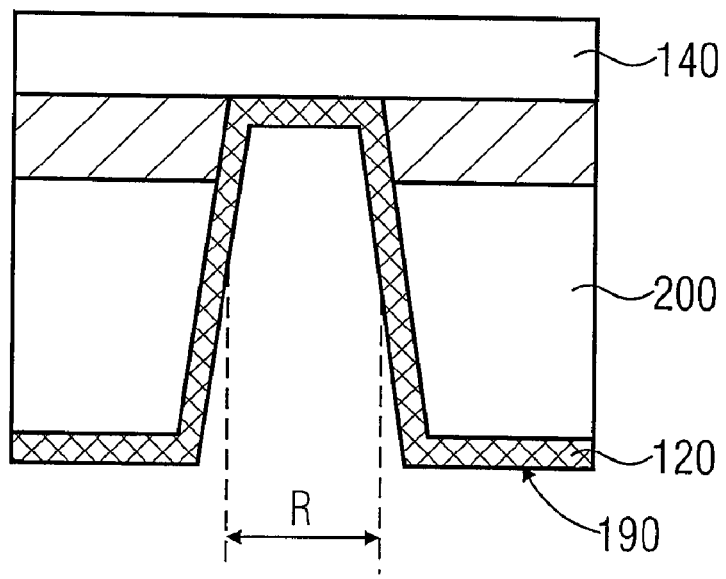

FIG. 8D shows, as a next step, a forming of the second electrode 120, which, for example, can be done by a bottom metallization, so that the electrode layer 120 is formed on the substrate 200 from the backside 190 and over the region R on the semiconductor layer 140.

Figure 8E:
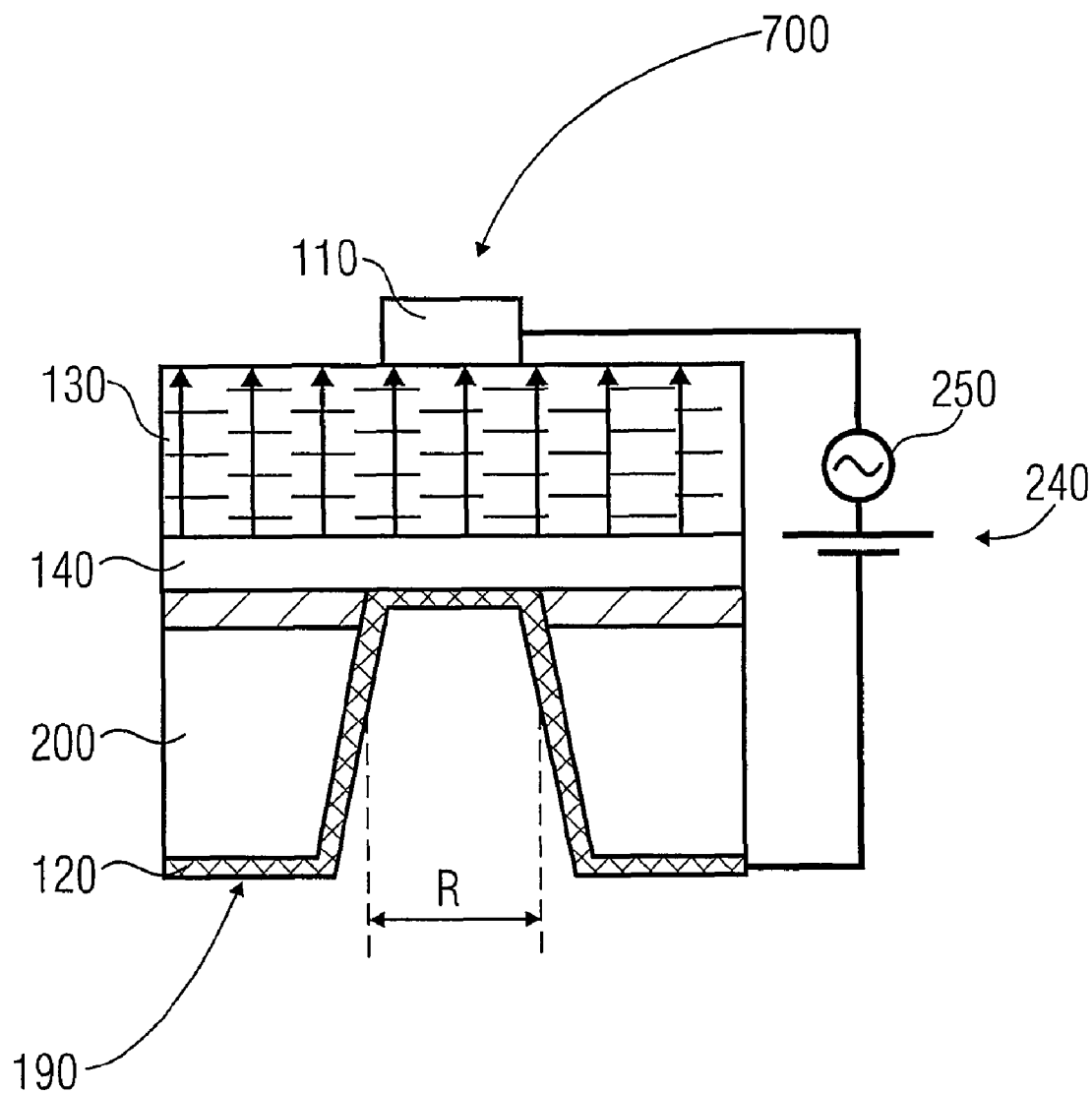

FIG. 8E shows that, as a further step in the processing, the piezoelectric layer 130 is arranged on the semiconductor layer 140 and, finally, the first electrode 110 is arranged on the piezoelectric layer 130 over the region R so that the semiconductor layer 140 is arranged between the piezoelectric layer 130 and the second electrode 120. The region R defines the resonator region. The result is a serial resonance tunable resonator 700. After the layer stack of the serial resonance tunable resonator 700 has been formed, the first electrode 110 and the second electrode 120 are contacted with a DC voltage 240 and can be connected to the high frequency signal path 250.

The region R, over which the substrate 200 has been removed on the backside 190, defines the region in which the BAW device is formed. Along the substrate 200 and/or the piezoelectric layer 130, different regions can be formed, so that different BAW devices can be arranged on different places along a given piezoelectric layer 130.

These steps can also be performed in a different order; for example, the forming of the second electrode 120 (and the other steps shown in the FIGS. 8B to 8D) can be performed at the end of the processing, so that an air interface on the backside 190 appears. An air interface can also make an acoustic mirror 230 redundant, which means the layer stack of high and low acoustic impedance materials 232 and 234 is not needed in this particular case, since the air below the bottom electrode represents an excellent acoustical mirror.

Hence, FIGS. 8A to 8E showed a technical realization of a serial resonance tunable resonator 700 (series capacitor in a BAW layer stack), which can be realized as a membrane device, so that neither the first electrode 110 nor the second electrode 120 over the region R where the BAW device is formed, is in mechanical contact with another solid or liquid material (there is air on both sides).

A parallel resonance tunable resonator related to the equivalent circuit as shown in FIG. 4B can be realized in a similar way starting again from an exemplary SOI wafer, as it is shown in FIG. 8A.

Figure 9:
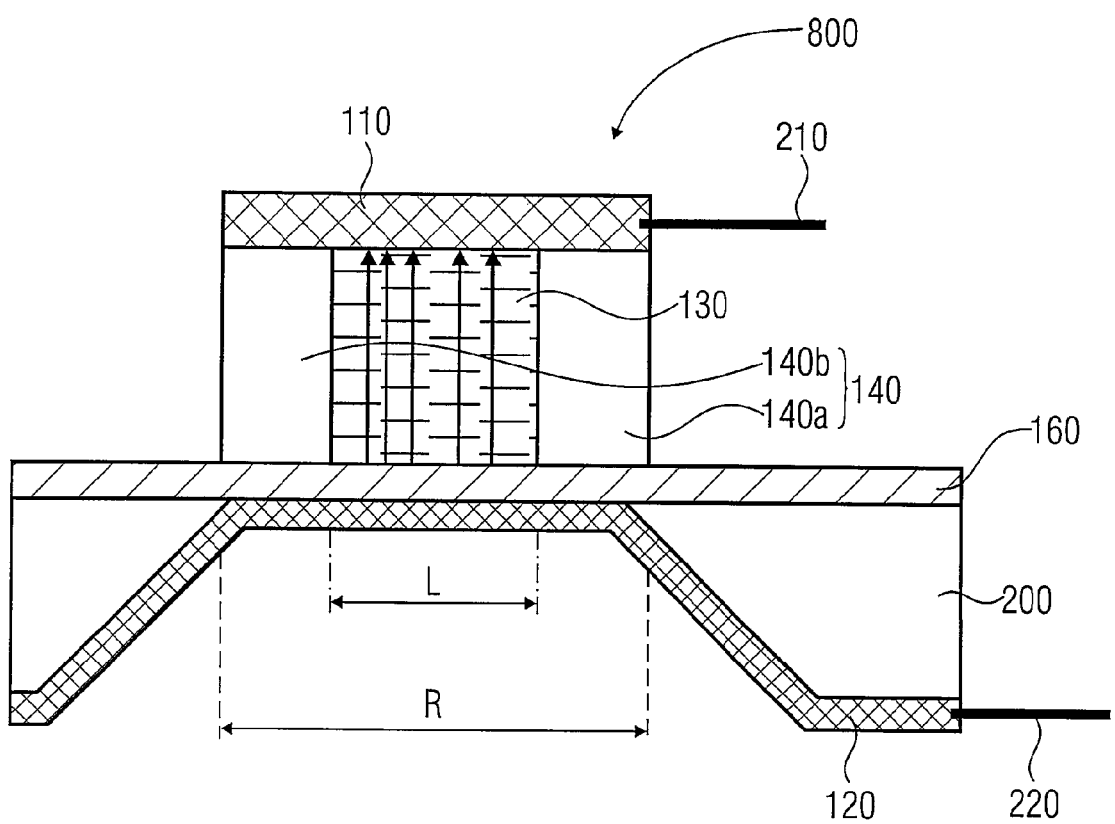
FIG. 9 shows a BAW device comprising a parallel resonance DC-tuned resonator according to a further embodiment.

FIG. 9 shows a final structure of an embodiment for a parallel resonance tunable resonator 800. In this embodiment the processing can start again as shown in FIG. 8A and an opening in the substrate 200 over the region R is formed as in FIG. 8B (which, again can be done by a wet etching stopping on the isolating layer 160). In this embodiment the isolating layer 160 is not etched and the semiconductor layer 140 is arranged differently.

The result is shown in FIG. 9. The parallel resonance tunable resonator 800 comprises an isolating layer 160, which, on one side, is contacted by the second electrode layer 120 over a region R and outside the region R, the isolating layer 160 is on the side separated from the second electrode layer 120 by the substrate 200. On an opposite side of the isolating layer 160, the piezoelectric layer 130 is arranged over a further region L, wherein the further region L is inside the region R. Over a remaining part of the region R (which is outside or not part of the further region L), the semiconductor layer 140 is formed on the isolating layer 160, so that in the cross sectional view of FIG. 9, the piezoelectric layer 130 separates a first and second part of the semiconductor layer 140a and 140b along the lateral direction of the isolating layer 160. On both the piezoelectric layer 130 and the semiconductor layer 140 the first electrode 110 is formed, so that the piezoelectric layer 130 and the semiconductor layer 140 is arranged next to each other between the first electrode 110 and the isolating layer 160.

FIG. 9 shows a cross sectional view, wherein the semiconductor layer 140 comprises a first part 140a and a second part 140b, which can be part of a single structure, for example, appearing as a ring or rectangular when viewed from the top or bottom of the resonator stack.

The first electrode 110 is connected to a first terminal 210 and the second electrode 120 is connected to a second terminal 220. As in the embodiment shown in FIG. 8E between the first terminal 210 and the second terminal 220 of FIG. 9, a DC voltage 240 is applicable in addition to a high frequency signal 250.

In further embodiments the isolating layer 160 is optional, so that depending on the materials and the doping of the semiconductor layer (see below) the isolating layer 160 can also be absent.

In comparison to the serial resonance tunable resonator 700, as shown in FIG. 8E, the semiconductor layer 140 is arranged parallel to the piezoelectric layer 130 for the parallel resonance tunable resonator 800 and is arranged in series for the serial resonance tunable resonator 700. The serial or parallel arrangement can be related to a passing RF-signal through the BAW device.

For both processing, which means for the serial and parallel resonance tunable resonators 700 and 800, the exemplary deep silicon back etch and bottom metallization can be performed at the end of the process instead of at the beginning thereof.

The DC voltage 240 can also be tuned dynamically, which means, the DC voltage can change with time, so that a readjustment of the resonance frequencies (serial, parallel or both) can be done at any time and can especially compensate for deviations of the resonance frequencies due to temperature or other influences in operation of the BAW device.

In further embodiments, at least one of the first and second electrodes 110 and 120 comprise an assembly of layers with materials of different acoustic impedances as, for example, aluminum, titanium, tungsten, silver or copper. Especially aluminum and copper comprise a high conductivity and, moreover, are compatible with CMOS technology. A principle benefit of constructing electrodes comprising a plurality of layers is obtaining a higher electromechanical coupling coefficient, resulting from use of high acoustic impedance material (enabling larger filter bandwidths), and good electrical conductivity of an other material. This is especially true with a layered electrode structure comprising tungsten and aluminum.

The doping level of the semiconductor layer 140 can, for example, be within the range of $10^{14}$ to $10^{16}$ or around $10^{15}$ and can comprise Boron as one possible dopant. The thickness of the piezoelectric layer 130 can be within the range of 700 to 1500 nm or about 1000 nm, which can yield a width of the depletion layer 142 of about 900 nm within a tuning range of 5V (as DC voltage).

Possible materials for the semiconductor layer 140 comprise (besides silicon) III/V compounds (e.g., GaAs) with a high mobility for the charge carriers. The mobility should be high, since the conductivity of the non-depleted part of the semiconductor layer 140 depends strongly on the majority charge density and to maintain a low serial resistance the conductivity should be high. This is especially important, since the doping levels are chosen with respect to the tuning sensitivity (to be within a target range for the DC-voltage). It is also possible to use semiconductors that comprise a high band gap, which keeps the leakage current low. This is especially advantageous for embodiments of tunable parallel resonance, in which case the isolating layer 160 may be redundant. In addition, for the semiconductor layer 140 all (semiconducting) materials are possible, which allow a sufficient growth for the piezoelectric layer 130 (so that a reliable compound is formed). III/V-semiconductors represent possible materials for the semiconductor layer 140 (on which, for example, AlN as material for the piezoelectric layer 130 can be formed).

Possible materials for layers with high acoustic impedance comprise, for example: W, Mo, Pt, Ta, TiW, TiN, Ir, WSi, Au, $Al_2O_3$, SiN, $Ta_2O_5$ and zirconium-oxide, wherein the last four are dielectrical materials. Possible materials for the piezoelectric layers are, for example, AlN, ZnO, PZT and $LiNbO_3$. Materials for lower acoustic impedance are, for example, aluminum and silicon dioxide.

In further embodiments, other materials or metals for the electrodes, types of the semiconductor, piezoelectric materials, and acoustic mirror materials are possible.

In yet a further embodiment the piezoelectric layer 130 comprises a semiconductor material as, for example, AlN. This exemplary III/V-semiconductor offers the possibility to dope the piezoelectric layer 130 themselves or at least part of the piezoelectric layer. Hence, the semiconductor layer 140 and the piezoelectric layer 130 can be arranged as a single layer, which again can be doped to a level to ensure the above-mentioned sensitivity. In this case, a depletion layer will be formed within in the semiconducting piezoelectric layer 130. Since the voltage drop occurs only over the depletion layer, also the acoustic wave couples to the voltage only at the depletion layer. This effect can be used to manufacture a resonator with a tunable series resonance frequency. In this embodiment the tunable BAW resonator comprises two electrodes separated by a doped semiconductor piezoelectric layer.

What is claimed is:

1. A bulk acoustic wave (BAW) device, comprising:
   a first electrode;
   a second electrode;
   a piezoelectric layer disposed between the first and second electrodes, wherein the second electrode contacts the piezoelectric layer; and
   a semiconductor layer disposed between the first and second electrodes, wherein the semiconductor layer is electrically isolated from the first electrode.

2. The BAW device according to claim 1, wherein the semiconductor layer comprises a doped semiconductor layer with a doping level.

3. The BAW device according to claim 2, wherein the doping level comprises a moderate level.

4. The BAW device according to claim 1, wherein the first and second electrodes are configured to apply a tunable DC voltage to the first and second electrodes.

5. The BAW device according to claim 1, wherein the piezoelectric layer is sandwiched over a resonator region by the first and second electrodes and the piezoelectric layer extends outside the resonator region and the BAW device is formed as a membrane device with an air interface on both sides of the resonator region.

6. The BAW device according to claim 1, wherein the semiconductor layer comprises crystalline silicon.

7. The BAW device according to claim 1, further comprising an acoustic mirror, the acoustic mirror comprising a layer stack of layers of alternating materials of high and low acoustic impedances.

8. The BAW device according to claim 1, further comprising an isolating layer,
   the isolating layer being arranged between the second electrode and the semiconductor layer, so that the semiconductor layer is electrically isolated from the first and second electrodes, or
   the isolating layer being arranged between the piezoelectric layer and the semiconductor layer.

9. A serial tunable bulk acoustic wave (BAW) device, comprising:
   a first electrode;
   a second electrode;
   a semiconductor layer;
   a piezoelectric layer arranged between the first electrode and the semiconductor layer, the second electrode contacting the piezoelectric layer, wherein the semiconductor layer is arranged between the piezoelectric layer and the second electrode.

10. The serial tunable BAW device according to claim 9, wherein the semiconductor layer comprises a p-type doped silicon or an n-type doped silicon.

11. The serial tunable BAW device according to claim 9, further comprising an isolating layer and a substrate,
    wherein the serial tunable BAW device is arranged over a region of the piezoelectric layer and, outside the region, the second electrode is separated from the semiconductor layer by the substrate and the isolating layer.

12. The serial tunable BAW device according to claim 9, wherein the first electrode comprises a first terminal and the second electrode comprises a second terminal, the first and second terminals are adaptable to apply a tunable DC voltage.

13. A parallel tunable bulk acoustic wave (BAW) device, comprising:
    a first electrode;
    a second electrode;
    a semiconductor layer sandwiched between the first and second electrode; and a piezoelectric layer sandwiched between the first and second electrode, wherein the second electrode contacts the piezoelectric layer.

14. The parallel tunable BAW device according to claim 13, further comprising:
an isolating layer arranged between the second electrode and the piezoelectric layer, wherein the isolating layer is sandwiched between the second electrode and the semiconductor layer.

15. The parallel tunable BAW device according to claim 14, wherein the isolating layer comprises silicon oxide.

* * * * *